(12) United States Patent
Cerrelli et al.

(10) Patent No.: US 9,177,654 B2
(45) Date of Patent: Nov. 3, 2015

(54) SOLID-STATE MEMORY DEVICE WITH PLURALITY OF MEMORY CARDS

(71) Applicant: 2419265 Ontario Limited, Mississauga (CA)

(72) Inventors: Carmelo Cerrelli, Mississauga (CA); Steven Michael Spano, Dryden, NY (US)

(73) Assignee: BURST CORPORATION, Mississauga (CA)

( * ) Notice: Subject to any disclaimer, the term of this patent is extended or adjusted under 35 U.S.C. 154(b) by 0 days.

(21) Appl. No.: 14/280,239

(22) Filed: May 16, 2014

(65) Prior Publication Data

US 2015/0279470 A1  Oct. 1, 2015

Related U.S. Application Data

(63) Continuation-in-part of application No. 14/226,239, filed on Mar. 26, 2014.

(51) Int. Cl.
*G06F 12/00* (2006.01)
*G06F 13/00* (2006.01)
*G06F 13/28* (2006.01)
*G11C 16/10* (2006.01)

(52) U.S. Cl.
CPC ...... *G11C 16/107* (2013.01); *G06F 2212/7206* (2013.01)

(58) Field of Classification Search
CPC ...................... G06F 2212/7206; G11C 16/107
See application file for complete search history.

(56) References Cited

U.S. PATENT DOCUMENTS

| | | | |
|---|---|---|---|
| 5,452,251 A * | 9/1995 | Akaogi et al. | 365/200 |
| 5,687,390 A * | 11/1997 | McMillan, Jr. | 710/5 |
| 6,426,893 B1 * | 7/2002 | Conley et al. | 365/185.11 |
| 6,744,692 B2 * | 6/2004 | Shiota et al. | 365/230.03 |
| 6,820,148 B1 | 11/2004 | Cedar et al. | |
| 6,941,403 B2 | 9/2005 | Cedar et al. | |

(Continued)

FOREIGN PATENT DOCUMENTS

| | | | |
|---|---|---|---|
| CA | 2309820 A1 | 5/1999 | |
| WO | WO2009/038257 A1 * | 3/2009 | G06F 1/00 |
| WO | 2013091104 A1 | 6/2013 | |

OTHER PUBLICATIONS

16Gb, 32Gb, 64Gb, 128Gb Asynchronous/Synchronous NAND Features, Micron, retrieved from http://media.digikey.com/pdf/Data%20Sheets/Micron%20Technology%20Inc%20(Dont%20-link%20-%20Proprietary)/16Gb,32Gb,64Gb,128Gb%20Async-Sync%20NAND.pdf on Jul. 15, 2014 (158 pages).*

(Continued)

*Primary Examiner* — Tuan Thai
*Assistant Examiner* — Daniel C Chappell
(74) *Attorney, Agent, or Firm* — Perry + Currier Inc.

(57) ABSTRACT

A solid-state memory device includes a physical port, an interface controller connected to the physical port, a serial peripheral interface, and a plurality of memory card sticks connected to the serial peripheral interface. Each memory card stick has a plurality of memory cards. The solid-state memory device further includes a controller core connected between the interface controller and the serial peripheral interface. The controller core is configured to present to a host connected at the physical connector a single non-volatile storage unit with a total capacity substantially equal to a sum of capacities of the plurality of memory card sticks.

22 Claims, 8 Drawing Sheets

(56) References Cited

U.S. PATENT DOCUMENTS

| | | | |
|---|---|---|---|
| 7,233,489 B2* | 6/2007 | Toyama et al. | 361/679.31 |
| 7,975,105 B1* | 7/2011 | Sun et al. | 711/115 |
| 7,986,553 B2* | 7/2011 | Roohparvar | 365/185.03 |
| 8,037,229 B2 | 10/2011 | Zer et al. | |
| 8,209,461 B2* | 6/2012 | Sinclair et al. | 711/103 |
| 8,275,933 B2* | 9/2012 | Flynn et al. | 711/103 |
| 8,364,884 B2* | 1/2013 | Nagadomi | 711/103 |
| 8,499,168 B2 | 7/2013 | Chen et al. | |
| 8,549,236 B2 | 10/2013 | Diggs et al. | |
| 8,566,652 B1* | 10/2013 | Nguyen et al. | 714/48 |
| 8,635,403 B2* | 1/2014 | Sun et al. | 711/115 |
| 8,904,095 B2* | 12/2014 | Kim et al. | 711/103 |
| 8,971,119 B2* | 3/2015 | Avila et al. | 365/185.17 |
| 2005/0055479 A1 | 3/2005 | Zer et al. | |
| 2005/0251632 A1* | 11/2005 | Hsieh | 711/154 |
| 2007/0047327 A1* | 3/2007 | Goda et al. | 365/185.29 |
| 2008/0147962 A1* | 6/2008 | Diggs et al. | 711/103 |
| 2009/0083476 A1* | 3/2009 | Pua et al. | 711/103 |
| 2009/0276566 A1* | 11/2009 | Coatney et al. | 711/114 |
| 2010/0125695 A1 | 5/2010 | Wu et al. | |
| 2010/0205355 A1 | 8/2010 | Moskalik | |
| 2011/0060862 A1* | 3/2011 | Warren | 711/103 |
| 2012/0198127 A1* | 8/2012 | Lan et al. | 711/103 |
| 2012/0278534 A1* | 11/2012 | Sun et al. | 711/103 |
| 2012/0278541 A1* | 11/2012 | Yamaki | 711/103 |
| 2013/0163175 A1* | 6/2013 | Kim et al. | 361/679.32 |
| 2013/0223147 A1* | 8/2013 | Kwak | 365/185.11 |
| 2014/0108703 A1* | 4/2014 | Cohen et al. | 711/103 |
| 2014/0136752 A1* | 5/2014 | Terada | 711/102 |
| 2014/0351487 A1* | 11/2014 | Kim | 711/103 |
| 2015/0039813 A1* | 2/2015 | Hsu et al. | 711/103 |
| 2015/0046638 A1* | 2/2015 | Choi et al. | 711/103 |
| 2015/0106554 A1* | 4/2015 | Balakrishnan | 711/103 |

OTHER PUBLICATIONS

TN-29-17: NAND Flash Design and Use Considerations, Micron, Apr. 2010, retrieved from http://www.micron.com/~/media/Documents/Products/Technical%20Note/NAND%20Flash/tn2917.pdf on Jul. 16, 2014 (8 pages).*

Definition FireWire, Margaret Rouse, Apr. 2007, retrieved from http://searchnetworking.techtarget.com/definition/FireWire on Jul. 16, 2014 (2 pages).*

Flash Memory Cards: What You Need to Know, Will Greenwald, Jul. 13, 2011, retrieved from http://www.pcmag.com/article2/0,2817,2388408,00.asp on Jul. 14, 2014 (6 pages).*

A Case for Redundant Arrays of Inexpensive Disks (RAID), Patterson et al, 1988, retrieved from http://www.cs.cmu.edu/~garth/RAIDpaper/Patterson88.pdf on Dec. 10, 2014 (8 pages).*

Definition of composite, Merriam-Webster Online Dictionary, retrieved from http://www.merriam-webster.com/dictionary/composite on Mar. 6, 2015 (1 page).*

Jim Cooke (Aug. 2007) "The Inconvenient Truths about NAND Flash Memory" Micron MEMCON '07 presentation, retrieved from https://www.micron.com/-/media/documents/products/presentation/flash_mem_summit_jcooke_inconvenient_truths_nand.pdf+&cd=1&hl=en&ct=clnk&gl=us on Jul. 16, 2014 (32 pages).*

Analysis: The Impact of Shifting From 512 Byte to 4 KB Sectors, Schmid et al, Oct. 27, 2010, retrieved from http://www.tomshardware.com/reviews/advanced-format-4k-sector-size-hard-drive,2759.html on Jul. 15, 2014 (12 pages).*

Andrew Liszewski; Recycle YOur Old microSD Cards into an SSD Drive; Sep. 26, 2013 downloaded from http://gizmodo.com/recycle-your-old-microsd-cards-into-an-ssd-drive-1404467902.

International Application No. PCT/CA2015/000170 International Search Report and Written Opinion dated Jun. 3, 2015.

* cited by examiner

US 9,177,654 B2

SOLID-STATE MEMORY DEVICE WITH PLURALITY OF MEMORY CARDS

FIELD

The present invention relates to electronic devices, more specifically, to electronic memory devices.

BACKGROUND

The demand for computer memory steadily increases. Modern hard disk drives suffer from a number of problems. Moving parts, such as rotating platters, can render hard disk drives unreliable. Heat generation and noise is also a concern. Solid-state drives have been developed, but many of these lack the low-cost capacity to effectively replace hard disk drives. In addition, some known techniques of collating smaller storage devices suffer from inefficiencies or are prone to data loss events.

SUMMARY

According to one aspect of the present invention, a solid-state memory device includes a physical port, an interface controller connected to the physical port, a serial peripheral interface, and a plurality of memory card sticks connected to the serial peripheral interface. Each memory card stick has a plurality of memory cards. The solid-state memory device further includes a controller core connected between the interface controller and the serial peripheral interface. The controller core is configured to present to a host connected at the physical connector a single non-volatile storage unit with a total capacity substantially equal to a sum of capacities of the plurality of memory card sticks.

BRIEF DESCRIPTION OF THE DRAWINGS

The drawings illustrate, by way of example only, embodiments of the present invention.

DETAILED DESCRIPTION

The present invention is directed to a solid-state memory device that allows a plurality of removable memory cards to emulate a universal serial bus (USB) mass storage device, serial ATA (SATA) hard disk drive, or similar device. This provides the ability to store large amounts of data within a bank of memory cards while retaining the convenience and functionality of known storage devices.

Figure 1:
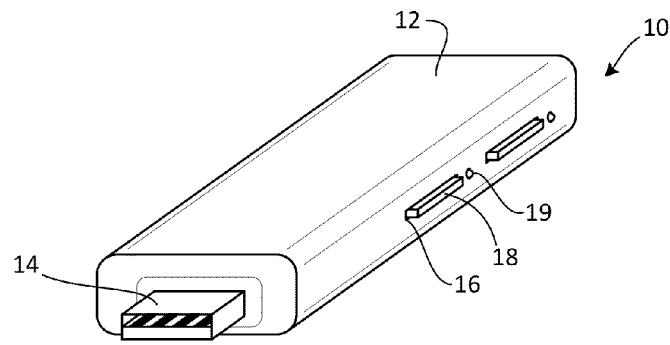
FIG. 1 is a perspective diagram of a solid-state memory device according to some embodiments.

FIG. 1 shows a solid-state memory device 10. The memory device 10 includes a housing 12 having a connector 14, such as a USB Type A plug that protrudes directly from the housing 12 to give the memory device 10 a configuration similar to a portable USB memory stick. The housing 12 further includes openings 16 aligned with a plurality of memory card connectors located inside the housing 12 to allow insertion and removal of a plurality of removable memory cards 18. Indicators 19, such as red and green bi-color status light-emitting diodes (LEDs) can be provided to indicate read/write access and/or faults. Although two openings 16 are shown, any number of openings 16 can be provided to receive any number of removable memory cards 18. The solid-state memory device 10 is portable and can directly plug into any suitable USB host device, such as a computer.

Figure 2:
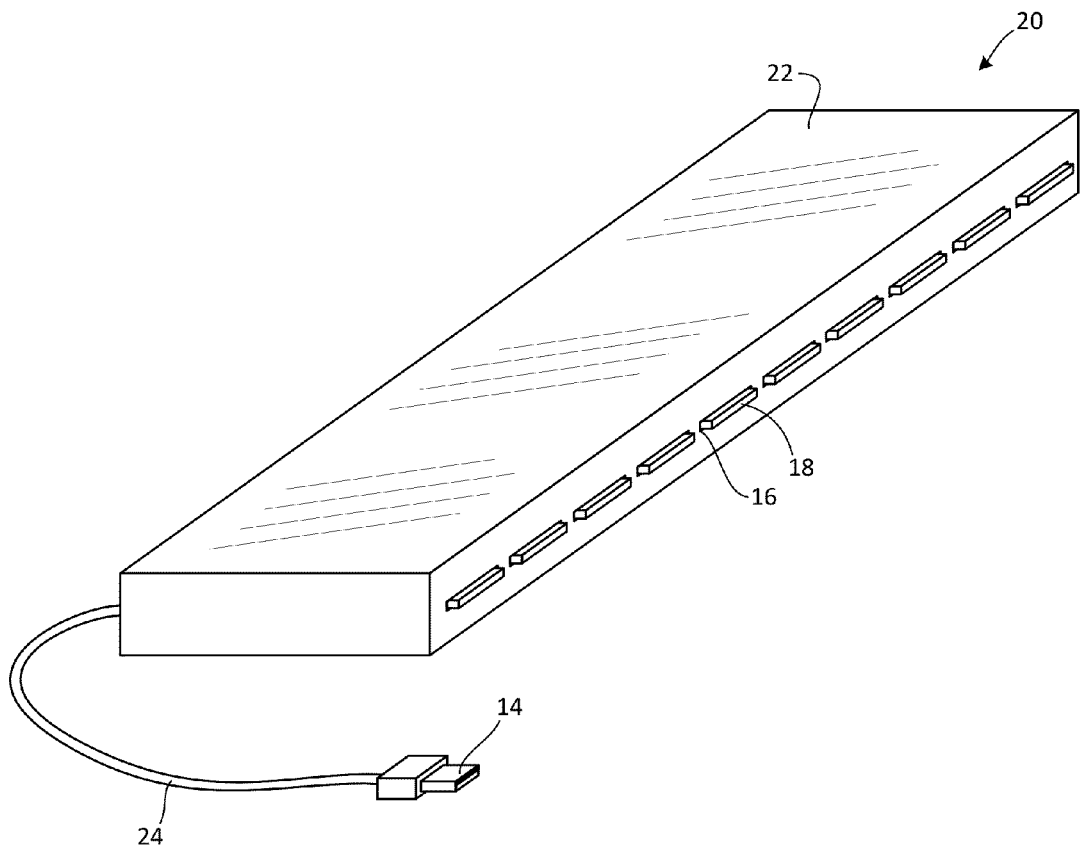
FIG. 2 is a perspective diagram of a solid-state memory device according to other embodiments.

FIG. 2 shows a solid-state memory device 20. Features and aspects of other embodiments described herein can be used with the presently described embodiments, and the description of like-identified components can be referenced. The memory device 20 includes a housing 22 and a connector 14, such as a USB Type A plug that is attached to a circuit board contained inside the housing by a USB cable 24. The housing 22 further includes openings 16 aligned with a plurality of memory card connectors situated inside the housing 22 to allow insertion and removal of a plurality of removable memory cards 18. Status indicators (not shown) may also be provided. Although ten openings 16 are shown, any number of openings 16 can be provided to receive any number of removable memory cards 18. The solid-state memory device 20 can be used as fixed or portable storage, with the cable 24 allowing it to plug into any suitable USB host device, such as a computer.

The removable memory cards 18 may be Secure Digital (SD) cards, miniSD cards, or microSD cards. The storage capacity of such cards can be any available size, such as 16 GB, 64 GB, 128 GB, 1 TB, etc., provided that number of cards and the file system selected supports such.

Figure 3:
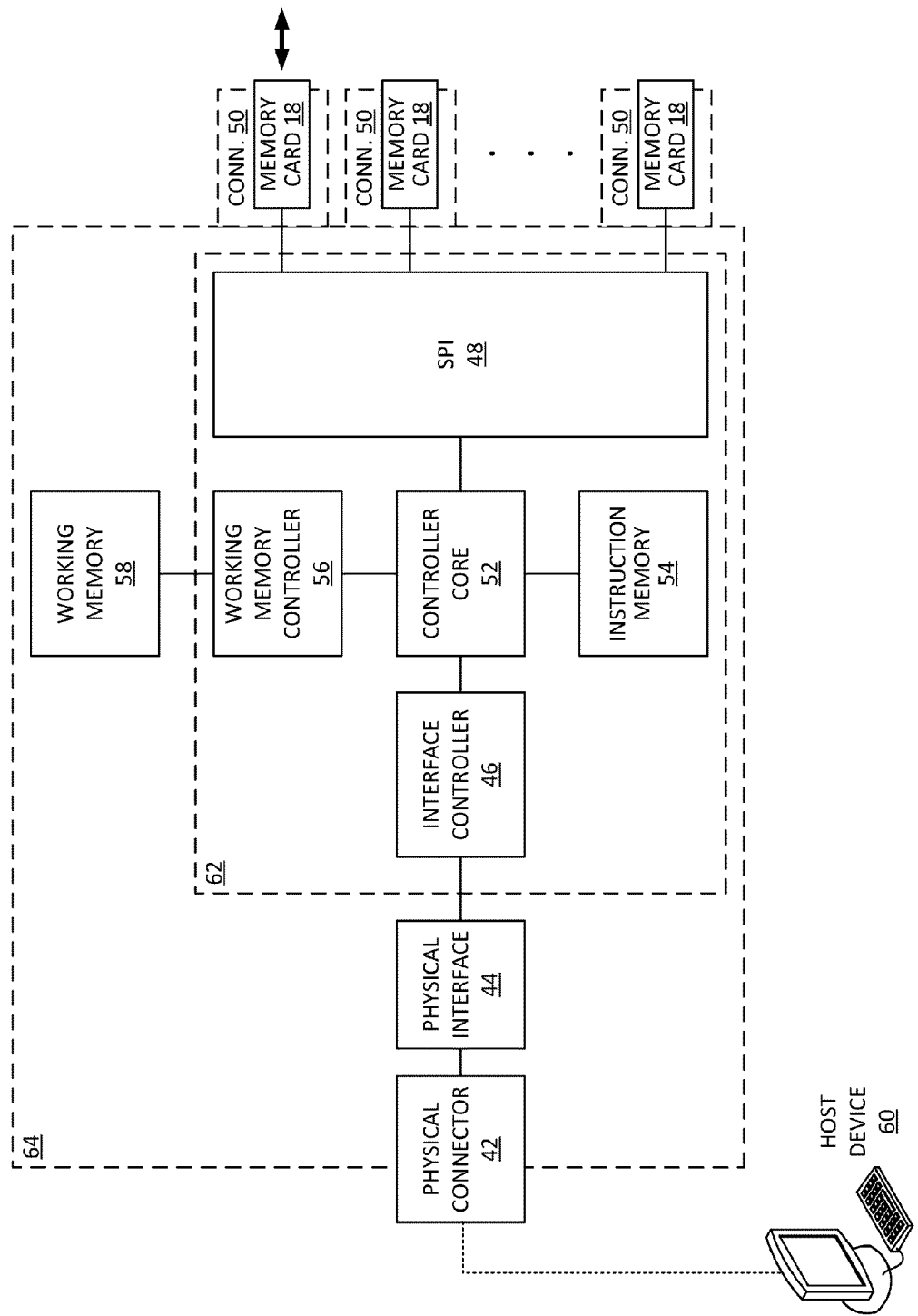
FIG. 3 is a block diagram of a solid-state memory device.
Figure 6A:
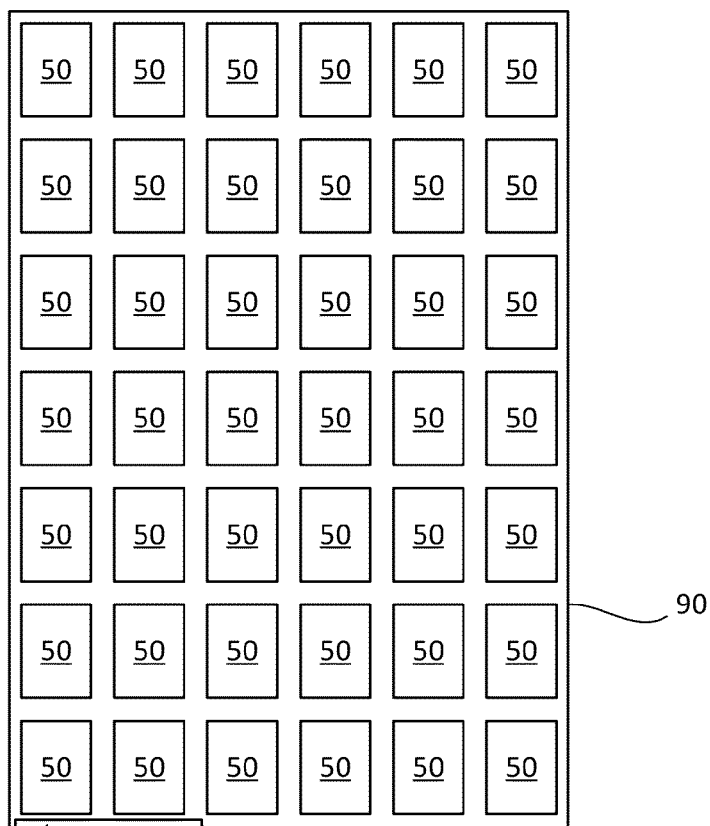
FIGS. 6a-6b are schematic diagrams of a solid-state memory device according to other embodiments.
Figure 6B:

FIG. 3 shows a block diagram of a solid-state memory device, such as the solid-state memory devices 10, 20 of FIGS. 1 and 2 and the device partially shown in FIGS. 6a-6b. The components of the memory device shown in FIG. 3 are examples, and the functionality discussed below can be implemented in other kinds of components, fewer more generalized components, or a greater number of more specialized components.

The solid-state memory device includes a physical connector 42, a physical interface 44 connected to the physical connector 42, an interface controller 46 connected to the physical interface 44, and a serial peripheral interface (SPI) 48. A plurality of memory card connectors 50 are connected to the SPI 48. Each memory card connector 50 is configured to receive a removable memory card 18. The memory device further includes a controller core 52 connected between the interface controller 46 and the serial peripheral interface 48 to manage mass-storage type access to the aggregate capacity of the memory cards 18. The memory device can further include instruction memory 54 connected to the controller core 52, a working memory controller 56 connected to the controller core 52, and working memory 58 connected to the working memory controller 56.

In some embodiments, the physical connector 14 is a universal serial bus (USB) connector that includes a USB Type A plug that is connectable to a USB host device 60, such as a computer. Alternatively, the USB connector 14 can include another type of USB connector or a connector made in accordance with another standard.

In some embodiments, the physical interface 44 is a USB physical interface 44 that is configured to translate digital logic signals between USB controller 46, which operates on 8-bit packets, and the two USB D+ and D− signal lines at the USB connector 42. The USB physical interface 44 can include a high-speed USB transceiver chip, such as those available under the designation USB3319 from Microchip Technology of Chandler, Ariz.

In some embodiments, the interface controller 46 is a USB controller 46 that is configured to transfer data, read/write commands, and handshaking and flow-control communications between the USB physical interface 44 and the controller core 52. The USB controller 46 operates on 8-bit packets.

The USB connector 14, physical interface 44, and controller 46 can be implemented according to the USB 2.0 Specification, USB 3.0 Specification, or similar.

The SPI 48 provides communication between the controller core 52 and the plurality of memory cards 18. In one example, the SPI 48 is configured to translate 32-bit read and write operations from the controller core 52 into 1-bit or 4-bit command and data cycles for the memory cards 18. The SPI 48 can also be connected to indicators 19 (FIG. 1) and control the indicators 19 to illuminate depending on read/write access and/or fault conditions.

The connectors 50 provide physical connections to the removable memory cards 18. The connectors 50 may be off-the-shelf items that allow physical removal and replacement of the removable memory cards 18. However, in some embodiments, the removable memory cards 18 may be locked in place, by for example the shape of the housing or other means, so as to physically prevent removal of memory cards 18.

The controller core 52 is configured to present the removable memory cards 18 to the host 60 as a single non-volatile storage unit with a total capacity substantially equal to the sum of individual capacities of the removable memory cards 18. In some embodiments, the controller core 52 operates on inbound 8-bit packets received from the USB controller 46 and likewise provides outbound 8-bit packets to the USB controller 46 for transmission to the host 60. The controller core 52 is configured to decode and respond to packets received from the host 60, and to communicate data between the host 60 and the plurality of removable memory cards 18. As such, the controller core 52 can be configured to operate the plurality of removable memory cards 18 according to a USB mass storage class device protocol and can thus be implemented to be responsive to any USB status/command/request packets that may be issued by the host 60 when connected to a USB mass storage class device. In other embodiments, such as in a SATA implementation, the controller core 52 operates on packets or other data structures of different size.

The controller core 52 can further be configured to use the working memory 58 as a buffer for data being communicated between the host 60 and the plurality of removable memory cards 18. The controller core 52 can be implemented as a programmable state machine, fixed logic structures, or a combination of such. The controller core 52 can be configured to operate on 32-bit logic.

The instruction memory 54 stores USB enumeration information, a command mapping for commands issuable by the host 60 and to which the controller core 52 is to respond, and one or more file routing tables for the plurality of removable memory cards 18. The instruction memory 54 may further include scratch pad memory for use by the controller core 52.

The command mapping may be configured with standard storage access commands that may be requested by the host 60.

The interface controller 46, controller core 52, instruction memory 54, and working memory controller 56, can be implemented in a field-programmable gate array (FPGA) 62, such as a Spartan6 from Xilinx Inc., or as program code executable on a microprocessor.

The working memory controller 56 allows the controller core 52 to access the working memory 58, which the controller core 52 uses as a buffer for data being communicated between the host 60 and the plurality of removable memory cards 18. In this example, the working memory 58 includes 16-bit DDR2 RAM, and the working memory controller 56 is configured to translate 32-bit read and write requests from the controller core 52 into 16-bit data, address, refresh, and control cycles for the working memory 58.

With the optional exception of the physical connector 42, in some embodiments, all of the components of the solid-state memory device can be provided in a multi-layer printed circuit board (PCB) 64 that is enclosed by a housing (e.g., housings 12, 22 of FIGS. 1-2). The physical connector 42 can also be provided on the same PCB 64, as shown in FIG. 1, when the solid-state memory device 10 has USB-key form factor. In other embodiments (FIGS. 2 and 6b), the physical connector 42 can be cable-connected to the PCB 64 to provide a desktop form factor.

Figure 4:
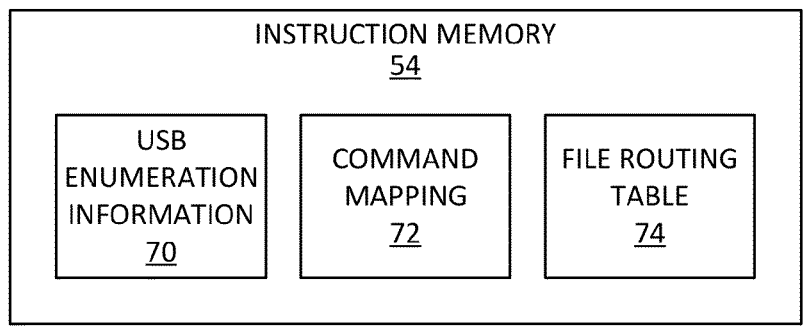
FIG. 4 is a block diagram of components of an instruction memory.

As shown in FIG. 4, in some embodiments, the instruction memory 54 stores USB enumeration information 70. The USB enumeration information 70 includes a device descriptor, configuration descriptor, interface descriptor, and any further information required for the host 60 to perform a USB enumeration sequence.

The instruction memory 54 can further store a command mapping 72. The command mapping maps commands, such as USB or ATA commands, which are expected to be issued by the host 60, to commands, such as ATA commands, that are compatible with the file system used on the memory cards 18.

The instruction memory 54 can further store a file routing table 74.

Figure 5:
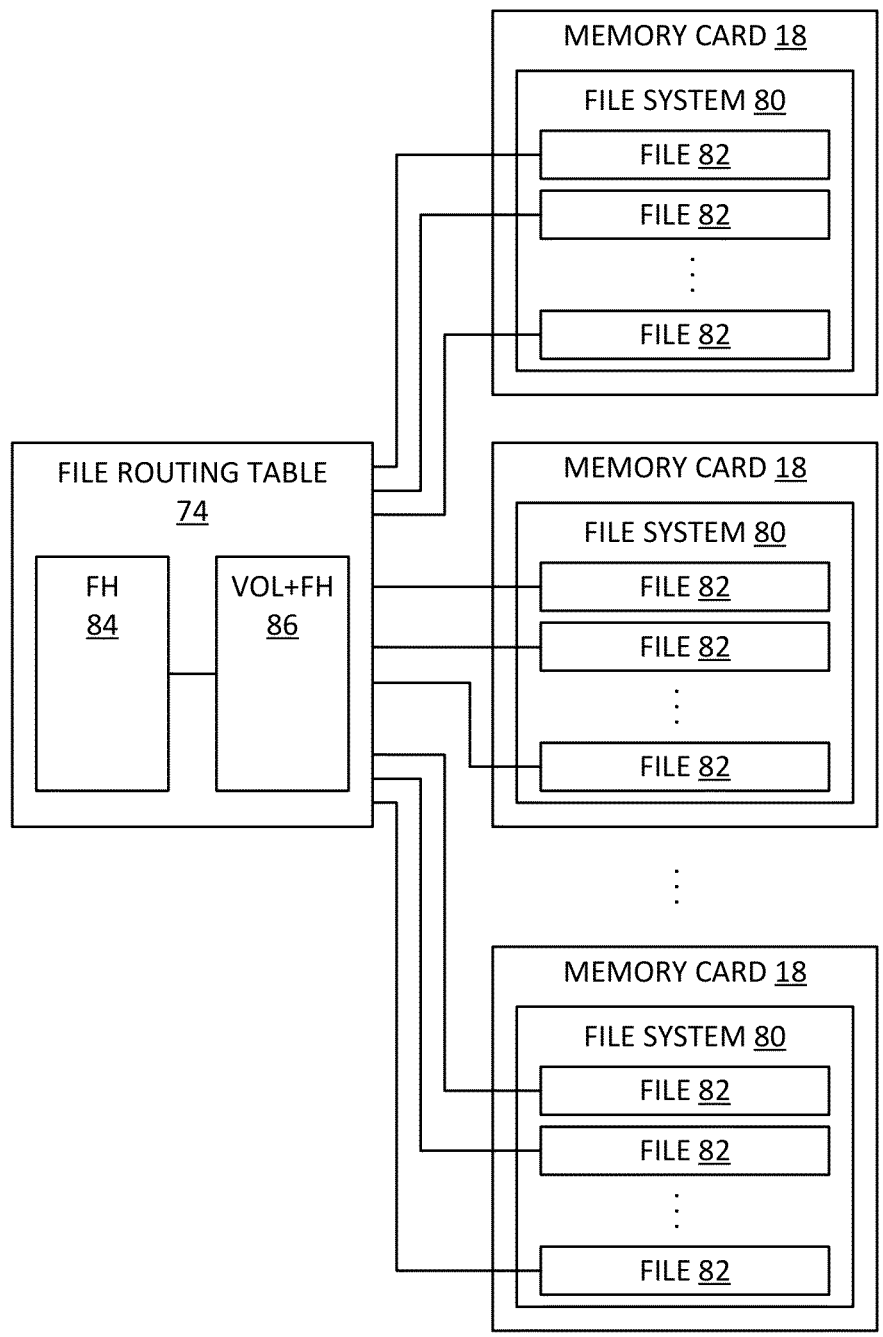
FIG. 5 is a block diagram of a file routing table and file systems.

As shown in FIG. 5, each memory card 18 operates under its own dedicated file system 80. In some embodiments, the file system is FAT32. In other embodiments, other file systems can be used, such as NTFS, exFAT, and the like. In some embodiments, each memory card 18 has its own independent file system and can be accessed separately, if removed. The file handles for files 82 in a given memory card 18 are unique, but this is not necessarily so when two or more memory cards 18 are considered.

The file routing table 74 stores information about the memory cards 18 and allows the memory cards 18 to be presented to the host 60 as a single, large storage volume having a total capacity equal to the summed capacities of the memory cards 18. This can be achieved by, for example, the file routing table 74 storing a set of unique, host-facing file handles 84 that maps to a superset of unique volume and file handle pairs 86 of the sets of files handles in the file systems 80. The set of unique file handles 84 is itself configured to abide by a file system, such as FAT32 or similar, which is seen by the host 60 as a single large volume. Thus, the host 60 uses a file handle in the set 84 when accessing a particular file and such host-facing file handle is translated into a volume and file handle pair of the set 86 for access to the correct memory card 18 and the correct file thereon.

The file routing table 74 can be configured to appear as a directory table to the host 60. However, the file routing table 74 replaces structural elements of the directory table, such as starting cluster, file size, etc., with the unique volume and file handle pairs 86 that uniquely identify files in the memory cards 18.

A file handle can be a file name, a file name and extension, or other identifier native to the file system. Collisions between host-facing file handles 84, as may happen when two or more files 82 of different memory cards 18 have the same file name, can be avoided by adding numerical suffixes or similar to the host-facing file handles 84.

Further, in some embodiments, the logic of the file routing table 74 is constrained to completely store a given file in one of the memory cards 18. To achieve this, the file routing table 74, or another table associated therewith, can maintain values representative of the remaining storage capacities of the memory cards 18. Before a new file is written, the controller core 52 can check the file routing table 74 to identify memory cards 18 that each individually have enough space remaining to store the entire file. The controller core 52 then selects one of the memory cards 18 that individually has enough space to store the file. A file is not permitted to span multiple memory cards 18, which can help reduce the chance of data loss, as is found in some kinds of conventional drive spanning techniques, and further can allow for hot-swapping of the memory cards 18 as well as permit their removal for individual use.

When the file routing table 74 is not exactly formatted as a directory table compatible with the file system of the aggregate volume as seen by the host 60, the controller core 52 can be configured to generate a representation of the file routing table 74 that is compatible with such when the host 60 requests access. Such a representation can be generated in real time and can be cached for subsequent use. Hence, additional information, such as memory card free space, may be stored in the file routing table 74 and the controller core 52 can be configured to not provide such information to the host 60 in response to access commands. Alternatively, two or more file routing tables 74 are used, where one such table 74 mimics a directory table for the benefit of the host 60, and the remaining one or more of such tables store other information, such as free space, about the memory cards 18 and files thereon.

The controller core 52 can be configured to re-enumerate and scan the solid-state storage device when a memory card 18 is removed, added, or swapped, so as to validate, create, or delete relationships between the file handles of the sets 84, 86 in the file routing table. Scanning includes the controller core 52 obtaining directories of each of the file systems 80 and creating a unique, host-facing file handle of the set 84 for each file in such directories, if no such file handle exists. Scanning further includes removing file handles from the host-facing set 84 for the volume associated with a memory card 18 that has been removed. When a file on a newly inserted memory card 18 has a file handle that is the same as a file handle on an already present memory card 18, the controller core 52 can be configured to generate an host-facing file handle for one of such files by adding a suffix to a file name (e.g., "my file" and "my file (1)"). The actual file name for such a file is not changed.

In other embodiments, the controller core 52 is configured to operate the plurality of removable memory cards 18 as a redundant array of independent disks (RAID). RAID mirroring can be implemented to allow for data redundancy to help prevent data loss. Any RAID level (e.g., RAID 1, RAID 2, etc.) practical can be used. In some RAID implementations, the memory cards 18 are not swappable as that may corrupt the RAID data. In other embodiments, the controller core 52 is configured to provide data encryption to provide a highly secure and fault tolerant mass storage device.

FIGS. 6a-6b illustrate other embodiments, in which a solid-state memory device is configured to provide a multitude of memory cards within a standard 3.5-inch hard disk housing. Features and aspects of other embodiments described herein can be used with the presently described embodiments, and the description of like-identified components can be referenced. A plurality of memory card connectors 50 is disposed on a substrate 90, such as a PCB. The substrate 90 includes a connector portion 92 for receiving connection of a flex cable 94 to electrically connect the memory card connectors 50 to the flex cable 94. A plurality of memory cards 18 can be coupled to the memory card connectors 50.

Several assemblies of substrate 90, memory card connectors 50, and installed memory cards 18 can be stacked and connected to a PCB 64 having the physical interface 44, the interface controller 46, the serial peripheral interface 48, the controller core 52, the instruction memory 54, the working memory controller 56, and the working memory 58 discussed with respect to FIG. 3. Each substrate 90 is connected to the PCB 64 via one or more flex cables 94. In some embodiments, the solid-state memory device is configured to replace a hard disk drive having a rotating platter. Accordingly, the physical interface 44 is a SATA physical interface, USB 2.0 or USB 3.0 interface, or similar. Similarly, the interface controller 46 is a SATA controller, USB 2.0 or USB 3.0 controller, or similar, and the physical connector 42 is a SATA connector, USB connector, or similar coupled to the PCB via a ribbon cable 96.

The stacked substrates 90 bearing the memory cards 18 together with the controller PCB 64 can be arranged to fit inside the standard volume of a 3.5-inch hard disk. A housing (not shown) may also be provided with standard fastening points to a computer chassis.

The plurality of memory cards 18 may be of the removable kind (e.g., microSD), but need not be user-removable. That is, the arrangement of the substrates 90 and PCB 64 can be permanent or semi-permanent, requiring special tools to access and remove a memory card 18 or preventing any memory card removal altogether.

Figure 7:
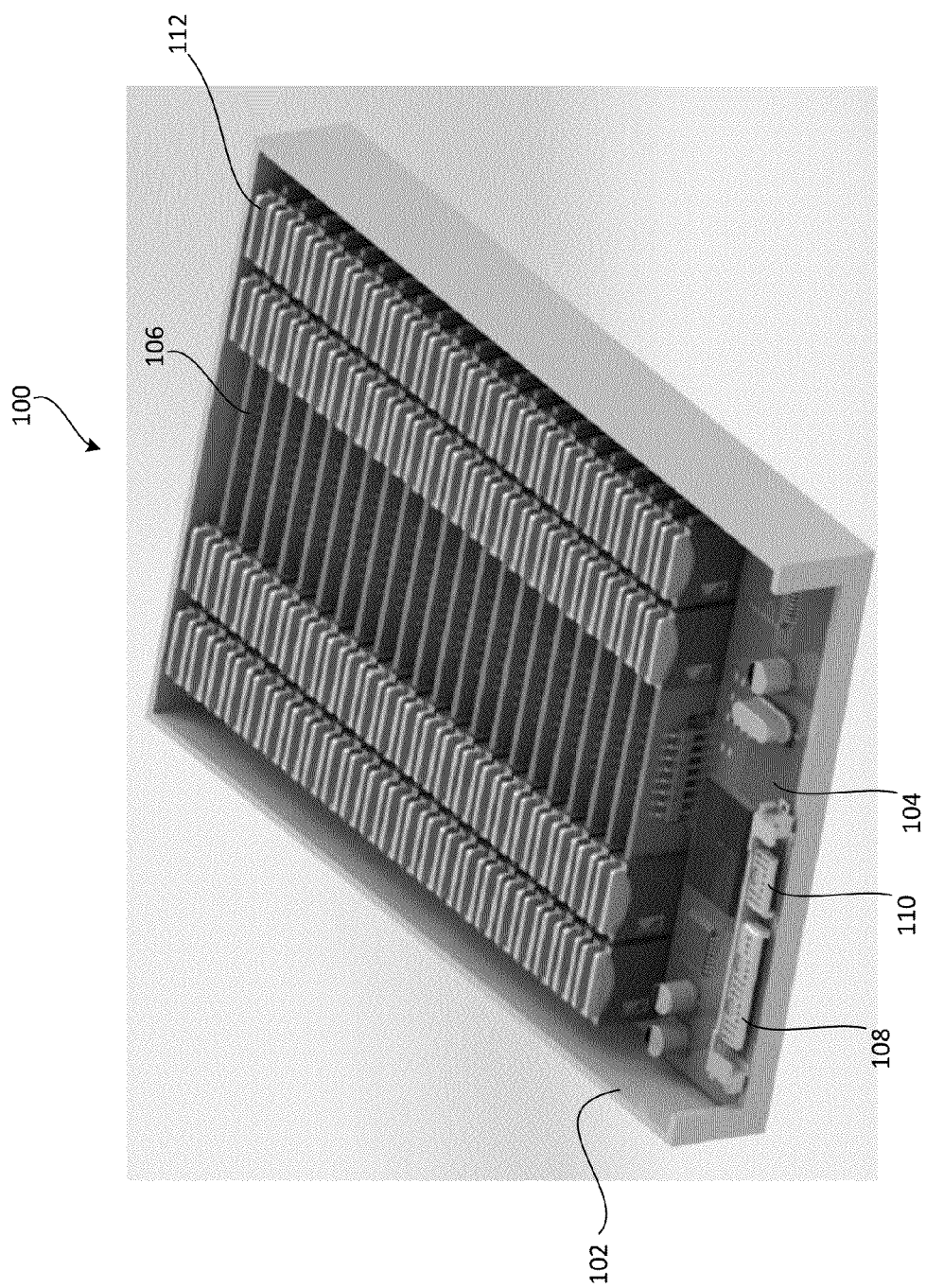
FIG. 7 is a perspective diagram of a solid-state memory device according to further embodiments.

FIG. 7 shows a perspective view of another embodiment of the present invention. A solid-state memory device 100 includes a housing 102, a controller board 104, and a plurality of memory card sticks 106. The solid state memory device 100 is a hard drive replacement that, as far as a host device is concerned, operates as a conventional hard drive with rotating platters. Features and aspects of the other solid-state memory devices described herein can be used for the solid-state memory device 100.

The housing 102 is sized and shaped to conform to a 3.5-inch hard disk drive housing standard. The housing 102 can include mounting points and/or hardware for internal mounting to a computer case, mounting to a rack server, or the like. In other embodiments, the housing 102 can be sized and shaped differently.

The controller board 104 is a multi-layer PCB that contains interface hardware for connecting to a host device, such as a computer, and allowing the host device to have read and write access the plurality of memory card sticks 106. In this embodiment, the controller board 104 includes a SATA port 108 and a USB port 110 for connection to one or more respective ports at a host device. In other embodiments, one of the SATA port 108 and the USB port 110 is provided. In still other embodiments, a different type of port is provided.

Each of the plurality of memory card sticks 106 includes a plurality of memory cards 112. In some embodiments, such as that depicted, several memory cards 112 (e.g., four) are mounted on one face of the memory card stick 106, while several other memory cards 112 (e.g., four) are mounted on an opposite face of the memory card stick 106. This may increase memory card density in space-constrained implementations.

The number of memory card sticks 106 provided and the number(s) of memory cards 112 provided to each memory card stick 106 is not particularly limited.

The memory cards 112 may be removable SD cards, miniSD cards, microSD cards, or the like. The memory cards 112 may be installed in the memory card sticks 106 in a removable or a non-removable manner. That is, the memory cards 112 may be of a removable kind (e.g., microSD), but need not be user-removable, as discussed above. The memory card sticks 106 may be removable or non-removable from the controller board 104. Making the memory card sticks 106 and/or the memory cards 112 removable may advantageously allow a malfunctioning memory card stick 106 and/or memory card 112 to be swapped out.

Figure 8:
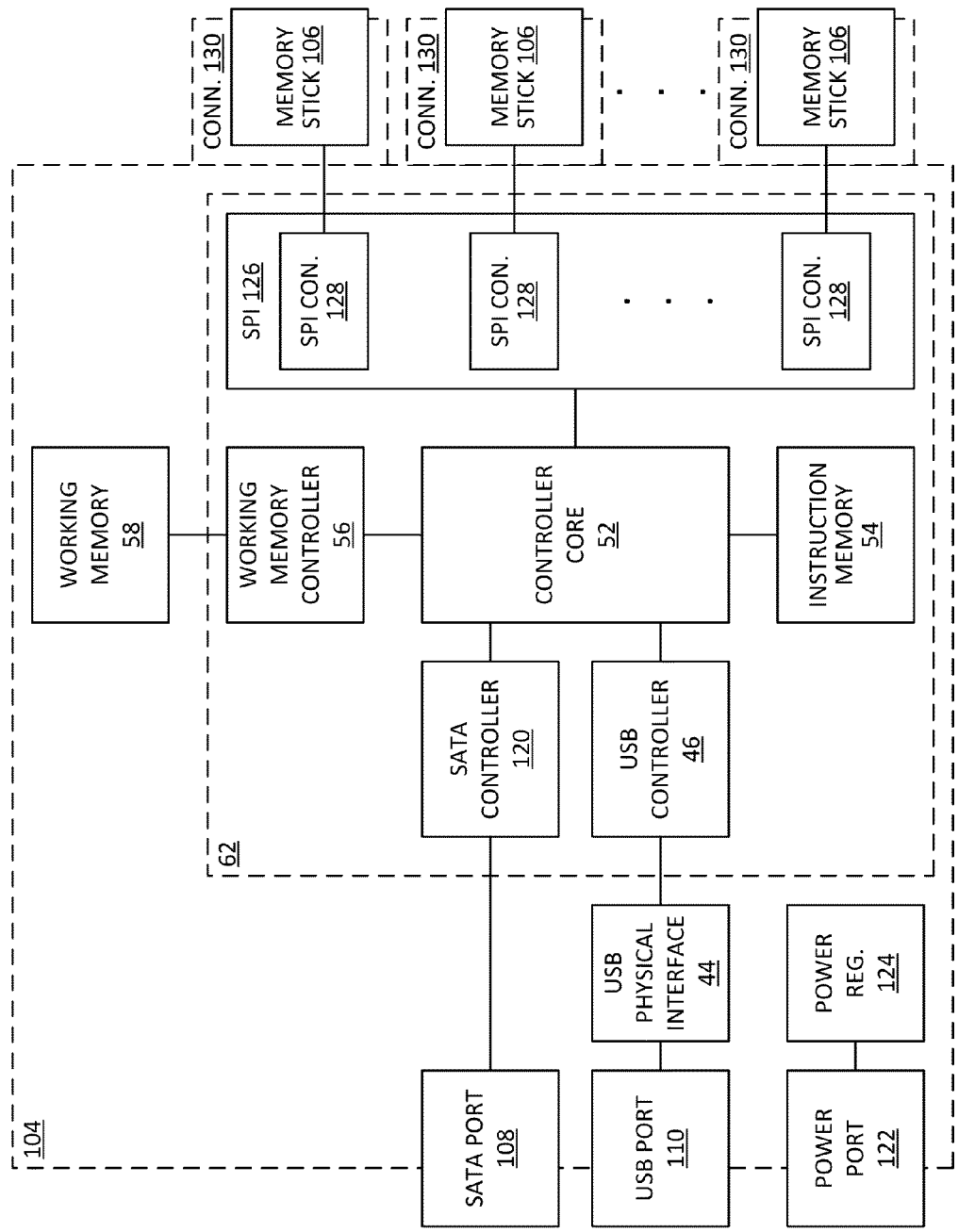
FIG. 8 is a block diagram of a solid-state memory device, such as that shown in FIG. 7.

FIG. 8 shows a block diagram of a solid-state memory device, such as the solid-state memory devices 100 of FIG. 7. The components of the memory device shown in FIG. 8 are examples, and the functionality discussed below can be implemented in other kinds of components, fewer more generalized components, or a greater number of more specialized components. Like reference numerals identify like components, and redundant description is omitted for sake of clarity.

The solid-state memory device includes a controller core 52, instruction memory 54, a working memory controller 56, and working memory 58. The controller core 52 is connected to the instruction memory 54 and the working memory controller 56, which is connected to the working memory 58. The controller core 52, instruction memory 54, and working memory controller 56 may be implemented by a suitably configured FPGA 62 disposed on the controller board 104. The description of FIG. 3 may be referenced for further detail.

The solid-state memory device further includes a SATA controller 120 connecting the SATA port 108 and the controller core 52. In this embodiment, the SATA controller 120 is configured to provide 8-bit data transfer in response to read/write commands and handshaking and flow-control between the controller core 52 and a SATA bus located at a host device connected to the SATA port 108. The SATA controller 120 can comply with an industry standard. When implemented on the FPGA 62 such as the Spartan6, the SATA controller 120 can be connected to the data port 108 via high-speed gigabit transceiver pins, which can allow a glueless or direct interface to the SATA bus of the host device. The SATA controller 120 and SATA port 108 can be configured to allow the solid-state memory device to be connected to the host device just as a conventional hard disk drive.

The USB physical interface 44 and USB controller 46, which are discussed in detail elsewhere herein, provide with the USB port 110 a USB mass storage interface for the solid-state memory device. A user can thus select whether to connect the solid-state memory device to the host device (e.g. computer) via a SATA connection or a USB connection.

The solid-state memory device further includes a power port 122 and a connected power regulator 124. The power port 122 is configured to receive power, if required, from an external source and the power regulator 124 is configured to regulate supply power and provide operational power to the solid-state memory device at any required voltage.

The solid-state memory device further includes an SPI 126. The SPI 126 includes a plurality of SPI controllers 128. Each SPI controller 128 provides communication between the controller core 52 and one of the memory card sticks 106. Each SPI controller 128 is configured to translate read and write operations from the controller core 52 into standard SD card 4-bit command and data cycles. Further, each SPI controller 128 is configured to communicate in parallel with all of the memory cards 112 of the respective memory card stick 106. Each SPI controller 128 can also be connected to indicators (e.g., indicators 19 of FIG. 1) and control the indicators to illuminate depending on read/write access and/or fault conditions of the respective memory card stick 106.

A plurality of memory stick connectors 130 is connected to the SPI 126. Each memory stick connector 130 is configured to physically connect a memory card stick 106 to a respective SPI controller 128.

Figure 9:
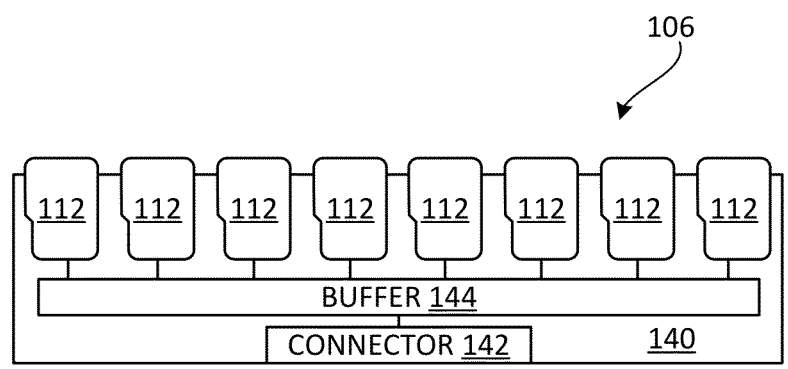
FIG. 9 is a diagram of a memory card stick having a plurality of memory cards.

FIG. 9 shows a diagram of one of the memory card sticks 106. The memory card stick 106 includes a PCB 140 on which the memory cards 112 are mounted by way of removable or non-removable connections. The memory card stick 106 further includes a physical connector 142 and a buffer 144 that connects the connector 142 to each of the memory cards 112.

The connector 142 may be the same component as the respective connector 130 (FIG. 8), or may be configured to mate with the connector 130 in a removable or non-removable manner.

The buffer 144 can be configured to control signal integrity and reduce noise of data communications between the connector 142 and the memory cards 112.

In the example shown, eight microSD memory cards 112 are provided on each memory card stick 106. However, the number of memory cards 112 is not particularly limited. In some examples, a 50 Mhz data clock is used to access the memory cards 112 and each memory card 112 is accessed via a 4-bit interface port. This can provide read speeds of 200 MB/s and write speeds of approximately 150 MB/s. The memory cards 112 are capable of being accessed in parallel, such that two or four memory cards 112 can be in the same read or write queue. This can further increase read/write speeds to about 800 MB/s read and 600 MB/s write. Such a memory card arrangement, when accessed via the SATA port 108 (FIG. 8), can allow data transfer rates at SATA 1, SATA 2, or SATA 3 speeds.

With reference back to FIG. 8, the controller core 52 is configured to provide parallel read/write access to the memory cards 112 of each memory card stick 106. The controller core 52 is configured to provide parallel access to the memory card sticks 106. Hence, a total capacity of the solid-state memory device is about equal to the sum of capacities of memory cards 112. Further, the read/write access time to the total storage capacity is decreased, relative to a read/write access time for an individual memory card 112, because of the parallel access to the memory card sticks 106.

In this embodiment, the solid-state memory device processes all read, write, delete, and similar file-access operations substantially exactly as a standard SATA hard disk drive and/or USB memory stick. The solid-state memory device is capable of emulating a SATA hard disk drive.

Figure 10:
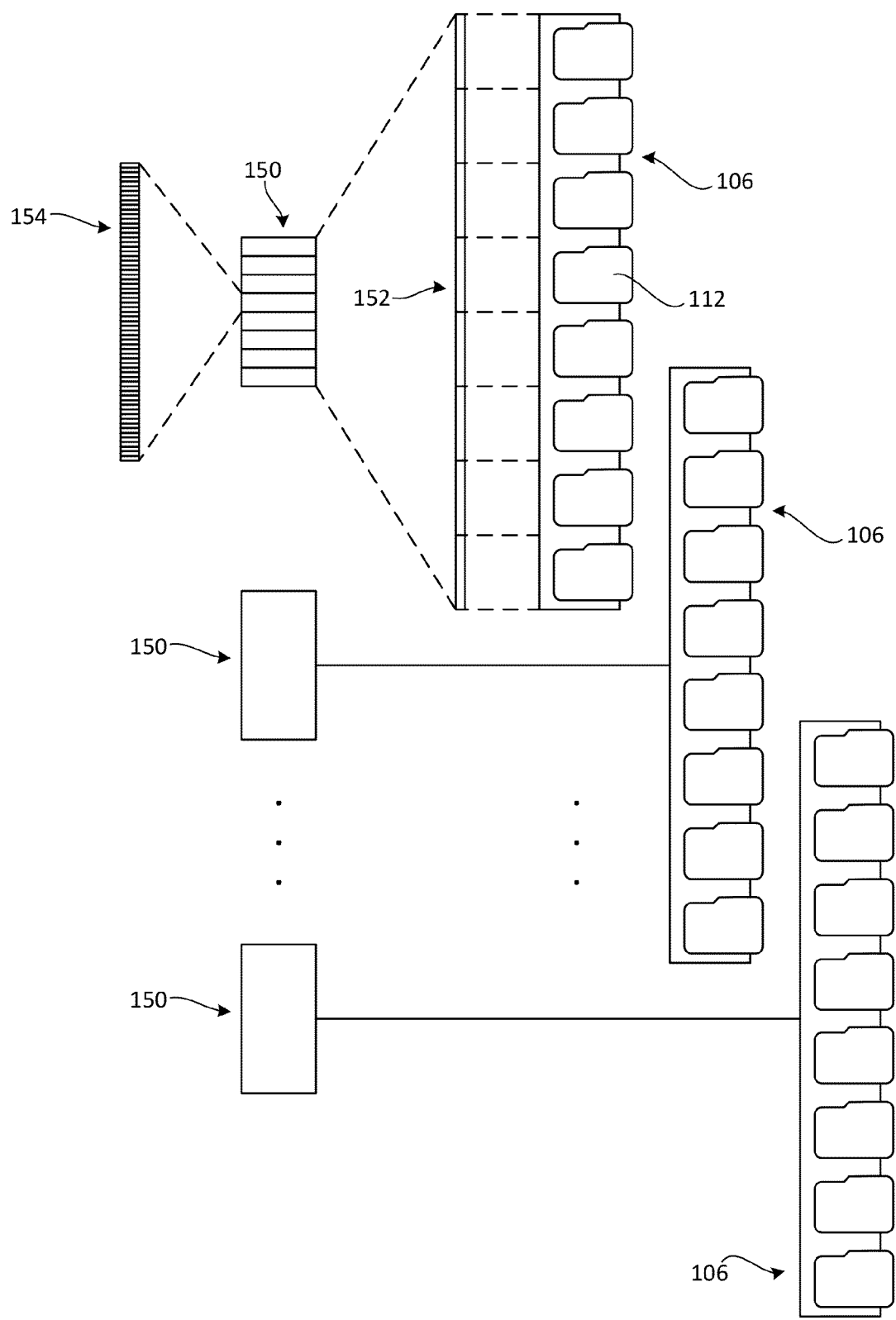
FIG. 10 is a diagram of a memory mapping.

FIG. 10 illustrates a memory mapping that the controller core 52 uses to map memory requests from the host device to the individual memory cards 112 of the memory card sticks 106. The memory mapping can be stored in the instruction memory 54 (FIG. 8) of the solid-state memory device. The controller core 52 can be configured to reference the memory mapping to access the memory cards 112, as discussed elsewhere herein.

The memory mapping defines a memory sector 150 that has a width 152 of N bytes, where N is the number of memory cards 112 per memory card stick 106. In this example, eight memory cards 112 are used resulting in a sector width 152 of eight bytes or 64 bits. Further in this example, the total sector size is selected to be 4 kilobytes (KB). The memory sector 150 is mapped to a host sector 154 used at the host device. In this example, the host sector 154 is one byte wide and has a total size of 512 bytes, which is compatible with a standard sector used by common computer operating systems for access to hard disk drives and similar storage devices. Thus, in this example, the memory mapping maps a standard 8-bit-wide 512 byte host sector 154 to a 64-bit-wide 4 KB memory-card sector 150.

In this embodiment, the memory cards 122 of each memory card stick 106 are accessed in parallel, without the capability of individual memory card access, resulting in the memory card stick 106 operating as a virtualized 64-bit wide memory card.

In this example, eight host sector 154 (512 bytes each) are mapped to one memory sector 150 (4 KB). Hence, a linear group of 64 host sectors 154 (32 KB) maps to eight memory sectors 150, while a linear group of 128 host sectors 154 (32 KB) maps to 16 memory sectors 150.

The memory mapping can further sequentially map memory sectors 150 to the memory card sticks 106. That is, for a group of memory sectors 150, the next memory sector 150 is assigned to the next memory card stick 106. For example, when 25 memory card sticks 106 are used, a first memory sector 150 is mapped to a first memory card stick 106, a second memory sector 150 is mapped to a second memory card stick 106, and so on, with a twenty-sixth memory sector 150 being mapped to a second memory sector of the first memory card stick 106.

Hence, the memory mapping can allow for writing and reading multiple memory sectors 150 in parallel because each memory sector 150 is sequentially mapped to a different memory card stick 106. Such parallel writing can result in increased speed for memory accesses up to the number of memory card sticks 106 used. In the example of 25 memory card sticks 106, approximately 100 KB (25 memory sectors of 4 KB) can be written simultaneously. Memory sector 150 to be written that number above the number memory card sticks 106 can be queued.

The solid-state device discussed above provides for access to multiple memory cards simultaneously to emulate a high-density, high-speed hard drive. Sector order is configured so that a sequential arrangement of sectors of a hard disk is mapped to the memory card sticks 106, allowing parallel/queued access for sequential sector reads and writes. The sector mapping is parallelized over individual memory cards, increasing access speeds. The solid-state device can read or write many sectors at once, keeping the USB or SATA interfaces full of data, in response to the host device requesting 32, 64, 128, or more sectors at a time.

In other embodiments, the controller core 52 is configured to operate the plurality of memory card sticks 106 as a RAID. RAID mirroring can be implemented to allow for data redundancy to help prevent data loss. Any RAID level (e.g., RAID 1, RAID 2, etc.) practical can be used. In other embodiments, the controller core 52 is configured to provide data encryption to provide a highly secure and fault tolerant mass storage device.

Advantages of the present invention can include a lack of moving parts, reduced heat generation, reduced noise generation, and low-cost capacity that may effectively replace hard disk drives and/or USB mass storage devices. Further, the present invention can provide for cheaper and denser storage capacity than some kinds of solid-state drives (SSDs). In addition, the capacity of a plurality of memory cards is combined in an efficient, user-friendly, and data-safe manner. In terms of high capacity, when 25 memory card sticks each containing eight 128 GB microSD cards are used, the resulting solid-state drive's capacity is about 25 TB.

While the foregoing provides certain non-limiting example embodiments, it should be understood that combinations, subsets, and variations of the foregoing are contemplated. The monopoly sought is defined by the claims.

What is claimed is:

1. A solid-state memory device comprising:
 a physical port;
 an interface controller connected to the physical port;
 a serial peripheral interface;
 a plurality of memory card sticks connected to the serial peripheral interface, each memory card stick having a plurality of memory cards; and
 a controller core connected between the interface controller and the serial peripheral interface, the controller core configured to present to a host connected at the physical port a single non-volatile storage unit with a total capacity based on capacities of the plurality of memory card sticks;
 wherein the controller core is further configured for parallel access to the plurality of memory cards of each of the plurality of memory card sticks with the capability of individual memory card access;
 wherein the controller core is further configured to access memory cards of each of the plurality of memory card sticks as a virtualized memory card;
 wherein the controller core is configured to operate according to a memory mapping to map memory request from the host to the plurality of memory cards of the plurality of memory card sticks, the memory mapping defining a memory sector for access to each memory card stick of the plurality of memory card sticks, the memory sector mapping to a plurality of host sectors mapped to a different memory card of each memory card stick; and
 wherein each memory sector of a plurality of memory sectors is mapped to a different memory card stick for writing and reading the plurality of memory sectors in parallel to increase speed of memory accesses.

2. The device of claim 1, wherein the controller core is configured to access the plurality of memory card sticks in parallel.

3. The device of claim 1, wherein each of the memory cards is removable and hot-swappable from the memory card stick.

4. The device of claim 1, wherein the memory sector that has a byte width equal to a number of the plurality of memory cards on one of the memory card sticks.

5. The device of claim 4, wherein the memory mapping maps the memory sector to a plurality of standard hard disk drive sectors.

6. The device of claim 5, wherein the memory mapping maps each memory sector of a sequential group of memory sectors to different ones of the memory card sticks.

7. The device of claim 5, wherein the memory sector is 4 kilobytes in size.

8. The device of claim 4, further comprising an instruction memory that stores the memory mapping.

9. The device of claim 1, further comprising a working memory controller connected to the controller core and working memory connected to the working memory controller, the controller core further configured to use the working memory as a buffer for data being communicated between the host and the plurality of memory card sticks.

10. The device of claim 1, wherein each of the plurality of memory cards is a secure digital (SD) card.

11. The device of claim 1, wherein the physical port is a serial ATA (SATA) port and the interface controller is a SATA controller.

12. The device of claim 11, further comprising a controller board at which are disposed the interface controller, the serial peripheral interface, and the controller core, wherein each of the memory card sticks comprises a printed circuit board on which the plurality of memory cards is disposed, wherein the printed circuit boards of the memory card sticks are connected to the controller board, and wherein the printed circuit boards of the memory card sticks and the controller board are arranged to fit within a 3.5-inch hard drive housing.

13. A solid-state memory device comprising:
a serial advanced technology attachment (SATA) port;
a SATA controller connected to the SATA port;
a serial peripheral interface;
a plurality of memory card sticks connected to the serial peripheral interface, each of the memory card sticks comprises a printed circuit board on which is disposed a plurality of memory cards;
a controller core connected between the SATA controller and the serial peripheral interface, the controller core configured to present to a host connected at the SATA port a single non-volatile storage unit with a total capacity substantially equal to a sum of capacities of the plurality of memory card sticks;
a controller board at which are disposed the SATA controller, the serial peripheral interface, and the controller core, wherein the printed circuit boards of the memory card sticks are connected to the controller board; and
a housing in which are disposed the controller board and the plurality of memory card sticks;
wherein the controller core is configured to access the plurality of memory card sticks in parallel and is further configured for parallel access to the plurality of memory cards of each of the plurality of memory card sticks without the capability of individual memory card access;
wherein the controller core is configured to operate according to a memory mapping defining a memory sector for access to each memory card stick of the plurality of memory card sticks, the memory sector mapping to a plurality of host sectors defined by the host, each host sector of the plurality of host sectors mapped to a different memory card of each memory card stick, the memory sector having a byte width equal to a number of the plurality of memory cards on one of the memory card sticks; and
wherein each memory sector of a plurality of memory sectors is mapped to a different memory card stick for writing and reading the plurality of memory sectors in parallel to increase speed of memory accesses.

14. The device of claim 13, wherein the memory mapping maps a memory sector to a plurality of standard hard disk drive sectors.

15. The device of claim 14, wherein the memory mapping maps each memory sector of a sequential group of memory sectors to different ones of the memory card sticks.

16. The device of claim 15, wherein the memory sector is 4 kilobytes in size.

17. The device of claim 13, further comprising an instruction memory that stores the memory mapping.

18. The device of claim 13, further comprising a working memory controller connected to the controller core and working memory connected to the working memory controller, the controller core further configured to use the working memory as a buffer for data being communicated between the host and the plurality of memory card sticks.

19. The device of claim 13, wherein each of the plurality of memory cards is a secure digital (SD) card.

20. The device of claim 13, wherein the housing is a 3.5-inch hard drive housing.

21. The device of claim 1, wherein the controller core is further configured to queue sequential reads and writes to the plurality of memory card sticks.

22. A solid-state memory device comprising:
a physical port;
an interface controller conned to the physical port;
a serial peripheral interface;
a plurality of memory card sticks connected to the serial peripheral interface, each memory card stick having a plurality of memory cards, wherein each of the memory cards is removable and hot-swappable from the memory card stick to help prevent data loss; and
a controller core connected between the interface controller and the serial peripheral interface, the controller core configured to present to a host connected at the physical port a single non-volatile storage unit with a total capacity substantially equal to a sum of capacities of the plurality of memory card sticks;
wherein the controller core is configured to access the plurality of memory card sticks in parallel and to queue sequential reads and writes to the plurality of memory card sticks, the controller core being further configured for parallel access to the plurality of memory cards of each of the plurality of memory card sticks without the capability of individual memory card access;
wherein any combination of capacities of memory cards and any number of memory cards can be removed or inserted within each memory card stick, while the solid-state memory device is operating, without affecting the functionality and usage of the solid-state memory device;
wherein the controller core is configured to operate according to a memory mapping to map memory requests from the host to the plurality of memory cards of the plurality of memory card sticks, the memory mapping defining a memory sector for access to each memory card stick of the plurality of memory card sticks, the memory sector mapping to a plurality of host sectors defined by the host, each host sector of the plurality of host sectors mapped to a different memory card of each memory card stick; and
wherein each memory sector of a plurality of memory sectors is mapped to a different memory card stick for writing and reading the plurality of memory sectors in parallel to increase speed of memory accesses.

* * * * *